(12) United States Patent
Baik et al.

(10) Patent No.: US 8,351,267 B2
(45) Date of Patent: Jan. 8, 2013

(54) METHOD OF PROGRAMMING NONVOLATILE MEMORY DEVICE

(75) Inventors: Seung Hwan Baik, Gyeonggi-do (KR); Ju Yeab Lee, Seoul (KR)

(73) Assignee: Hynix Semiconductors Inc., Gyeonggi-do (KR)

( * ) Notice: Subject to any disclaimer, the term of this patent is extended or adjusted under 35 U.S.C. 154(b) by 288 days.

(21) Appl. No.: 12/827,754

(22) Filed: Jun. 30, 2010

(65) Prior Publication Data

US 2010/0329022 A1    Dec. 30, 2010

(30) Foreign Application Priority Data

Jun. 30, 2009    (KR) .................. 10-2009-0059167

(51) Int. Cl.
   *G11C 16/04*    (2006.01)

(52) U.S. Cl. ............ 365/185.19; 365/185.24; 365/185.2

(58) Field of Classification Search ............. 365/185.19, 365/185.24, 185.2, 185.22, 185.28, 185.17
See application file for complete search history.

(56) References Cited

U.S. PATENT DOCUMENTS

| 7,652,925 | B2 * | 1/2010 | Sim .................. 365/185.19 |
| 7,656,710 | B1 * | 2/2010 | Wong ................ 365/185.19 |
| 7,778,087 | B2 * | 8/2010 | Tu et al. ............ 365/185.28 |

FOREIGN PATENT DOCUMENTS

| KR | 1020090011249 | 2/2009 |
| KR | 1020090014527 | 2/2009 |
| KR | 1020090035871 | 4/2009 |

OTHER PUBLICATIONS

Notice of Allowance issued from Korean Intellectual Property Office on May 31, 2011.

* cited by examiner

*Primary Examiner* — David Lam (74) *Attorney, Agent, or Firm* — IP & T Group LLP (57) ABSTRACT

A method of programming a nonvolatile memory device comprises performing a first program operation on first memory cells and second memory cells so that threshold voltages of the first and second memory cells have a first reference level lower than a first target level, the first memory cells having the first target level as a first target level, and the second memory cells having a second target level higher than the first target level as a second target level; performing a second program operation on the second memory cells so that the threshold voltages of the second memory cells have a second reference level lower than the second target level; and performing a third program operation on the first and second memory cells to have the respective target levels.

17 Claims, 4 Drawing Sheets

METHOD OF PROGRAMMING NONVOLATILE MEMORY DEVICE

CROSS-REFERENCE TO RELATED APPLICATION

Priority to Korean patent application number 10-2009-0059167 filed on Jun. 30, 2009, the entire disclosure of which is incorporated by reference herein, is claimed.

BACKGROUND

Exemplary embodiments relate to a method of programming a nonvolatile memory device and, more particularly, to a method of programming a nonvolatile memory device, which is capable of preventing a reduction in the reliability of a program operation resulting from interference between neighboring memory cells.

With an increase in the degree of integration of nonvolatile memory devices, the interval between memory cells for storing data is gradually narrowed. If the interval between the memory cells is narrowed, interference between the memory cells may increase during program, erase, and read operations of the nonvolatile memory device. In particular, during the program operations, interference between the memory cells becomes significant.

Figure 1:
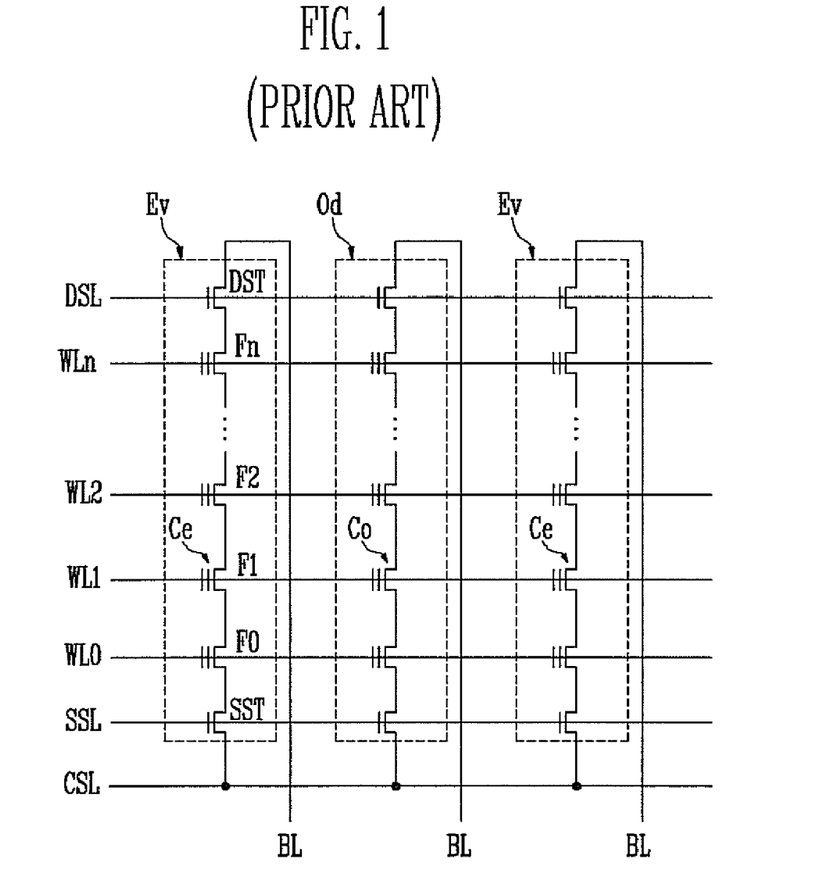
FIG. 1 is a circuit diagram showing a part of a nonvolatile memory device.
Figure 2:
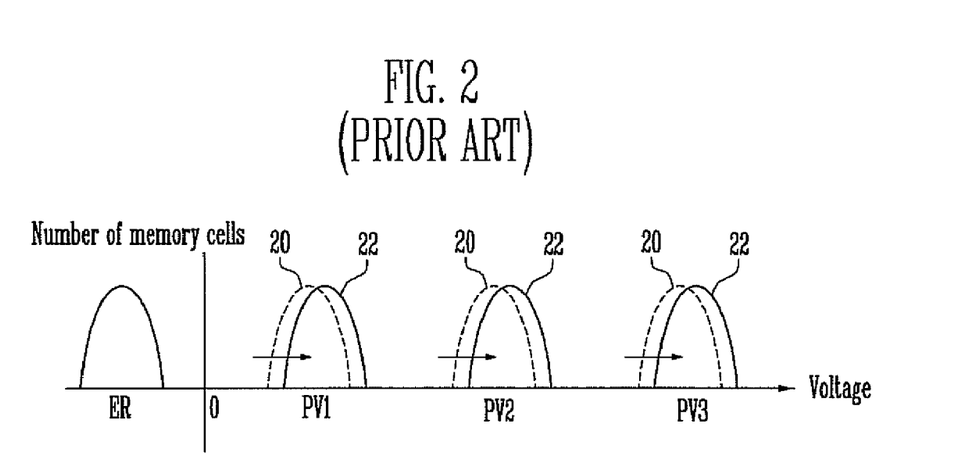
FIG. 2 is a diagram illustrating a related phenomenon.

FIG. 1 is a circuit diagram showing part of a nonvolatile memory device, and FIG. 2 is a diagram illustrating a related phenomenon.

Referring to FIG. 1, the memory cell array of the nonvolatile memory device includes a plurality of cell strings Ev and Od. Each of the cell strings Ev and Od includes a drain select transistor DST and a source select transistor SST and a plurality of memory cells F0 to Fn coupled in series between the drain select transistor DST and the source select transistor SST.

In particular, the even cell string Ev and the odd cell string Od are alternately selected in order to prevent/reduce interference occurring during the program operations. For example, if the even cell string Ev is selected, the odd cell string Od is not selected.

However, with an increased integration of semiconductor devices, although the even cell string Ev and the odd cell string Od are alternately selected and a program operation is performed on a selected cell string, interference may occur during the program operations of neighboring cells.

Referring to FIGS. 1 and 2, the threshold voltage of an even memory cell Ce is increased to a target level by programming the even memory cell Ce. Here, the even memory cell Ce may have an erase state ER, a first program state PV1, a second program state PV2, or a third program state PV3 depending on the level of the threshold voltage. In the case in which the even memory cell Ce has been programmed to have the first program state PV1, during the programming of an odd memory cell Co adjacent to the even memory cell Ce, the threshold voltage of the even memory cell Ce may rise because of interference between neighboring memory cells.

Due to such interference, threshold voltages may vary from target threshold voltages.

If, as described above, the threshold voltages of previously programmed cells rise due to interference generated during the program operations of neighboring cells, the reliability of a nonvolatile memory device may be reduced.

In order to alleviate such a concern, when selected memory cells are read, a read voltage may be controlled depending on whether neighboring cells have been programmed. Use of such a method, however, may slow the operation speed. In particular, an algorithm to determine whether a program has been performed and perform a re-program based on a result of the determination may be relatively complicated.

BRIEF SUMMARY

Exemplary embodiments relate to a method of programming a nonvolatile memory device, which is capable of preventing a reduction in the reliability resulting from interference between neighboring memory cells.

A method of programming a nonvolatile memory device according to a first aspect of this disclosure comprises performing a first program operation on first memory cells and second memory cells so that threshold voltages of the first and second memory cells have a first reference level lower than a first target level, the first memory cells having the first target level as a final target level, and the second memory cells having a second target level lower than the first target level as a final target level; performing a second program operation on the second memory cells so that the threshold voltages of the second memory cells have a second reference level higher than the second target level; and performing a third program operation on the first and second memory cells so that the threshold voltages of the first memory cells have the final target level and the threshold voltages of the second memory cells have the final target level.

The first to third program operations are performed in accordance with an incremental step pulse program (ISPP) method.

The first reference level is lower than the first target level by a voltage level corresponding to a shift in threshold voltages of neighboring memory cells between neighboring memory cells when program operations are performed on the second memory cells.

The method further comprises performing a fourth program operation on third memory cells so that threshold voltages of the third memory cells have a third reference level lower than a third target level, before performing the second program operation, wherein the third memory cells have the third target level as a final target level, and the third target level is higher than the first target level and lower than the second target level.

When the fourth program operation is performed, the second memory cells are programmed to have the third reference level.

The third reference level is lower than the third target level by a voltage level corresponding to a shift in threshold voltages of memory cells resulting from interference between neighboring memory cells when program operations are performed on the second memory cells.

The fourth program is performed in accordance with an ISPP method.

A method of programming a nonvolatile memory device according to a second aspect of this disclosure comprises performing a first program operation on memory cells to be programmed so that threshold voltages of the memory cells have a first level lower than a final target level and performing a second program operation on the memory cells so that the threshold voltages of the memory cells have the final target level.

According to a third aspect of this disclosure, there is provided a method of programming a nonvolatile memory device in which an even cell string and an odd cell string are coupled to a page buffer in common, comprising performing a first program operation on first memory cells so that the first memory cells have a first threshold voltage lower than a first final target level; performing a second program operation on second memory cells other than the first memory cells so that the second memory cells have a second threshold voltage lower than a second final target level; and performing a third program operation on the first and second memory cells so that the threshold voltage of the first memory cells and the threshold voltage of the second memory cells have the respective final target levels.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 3:
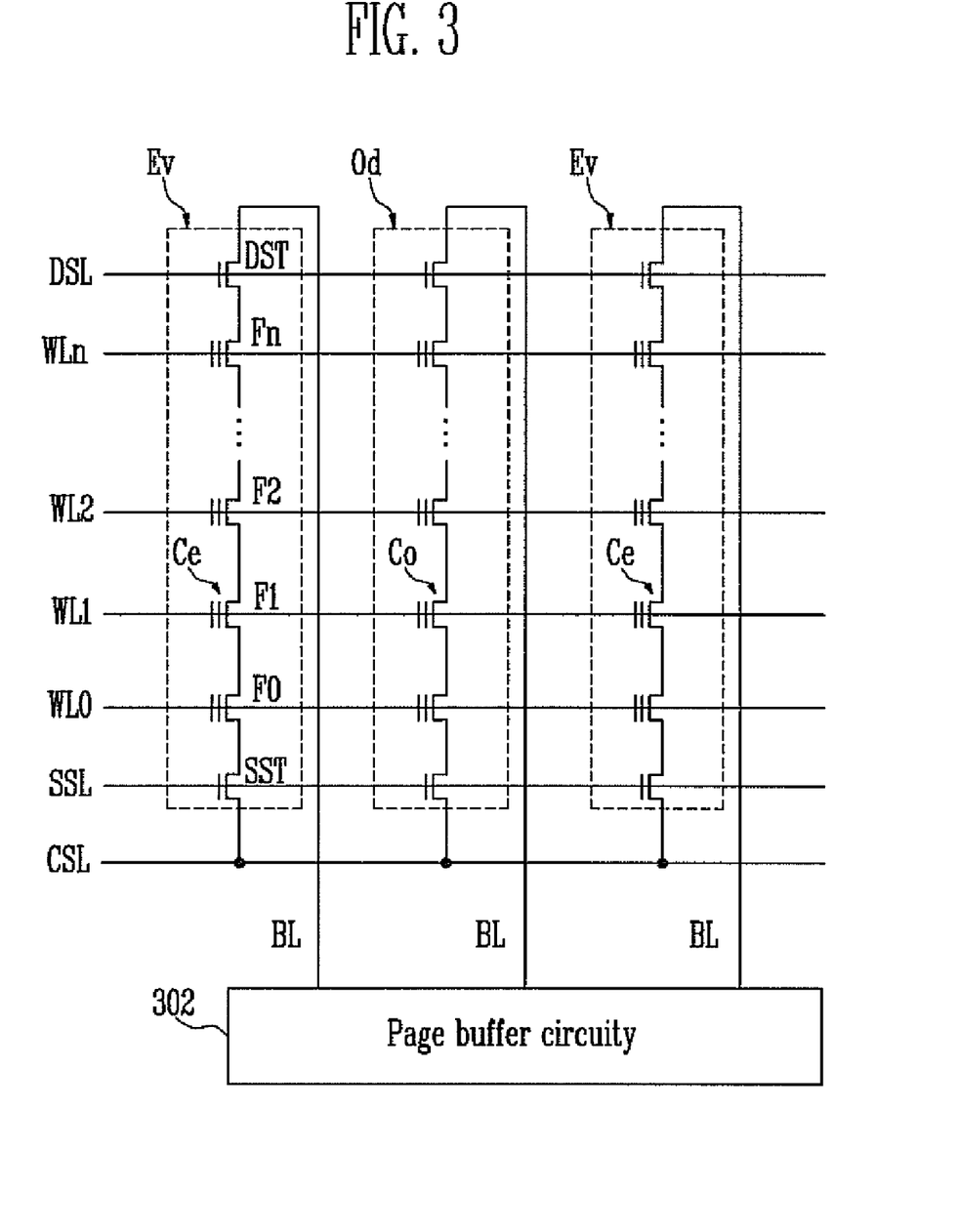
FIG. 3 is a circuit diagram illustrating a program method of a nonvolatile memory device according to an exemplary embodiment.

FIG. 3 is a circuit diagram illustrating a program method of a nonvolatile memory device according to an exemplary embodiment.

The memory cell array of the nonvolatile memory device includes a plurality of cell strings Ev and Od. The cell strings Ev and Od are divided into even cell strings Ev and odd cell strings Od, where they alternate. Each of the cell strings Ev and Od includes a drain select transistor DST and a source select transistor SST and a plurality of memory cells F0 to Fn coupled in series between the drain select transistor DST and the source select transistor SST. The drain of the drain select transistor DST is coupled to a bit line BL, and the source of the source select transistor SST is coupled to a common source line CSL. The gates of the drain select transistors DST included in the different cell strings EV and Od are interconnected to a drain selection line DSL. The gates of the memory cells F0 to Fn included in the different cell strings EV and Od are interconnected to respective word lines WL0 to WLn. The gates of the source select transistors SST included in the different cell strings Ev and Od are interconnected to a source selection line SSL. A page buffer circuitry 302 includes a plurality of page buffers (not shown). Each page buffer is connected in common to one or two cell strings through the bit lines BL.

Figure 4:
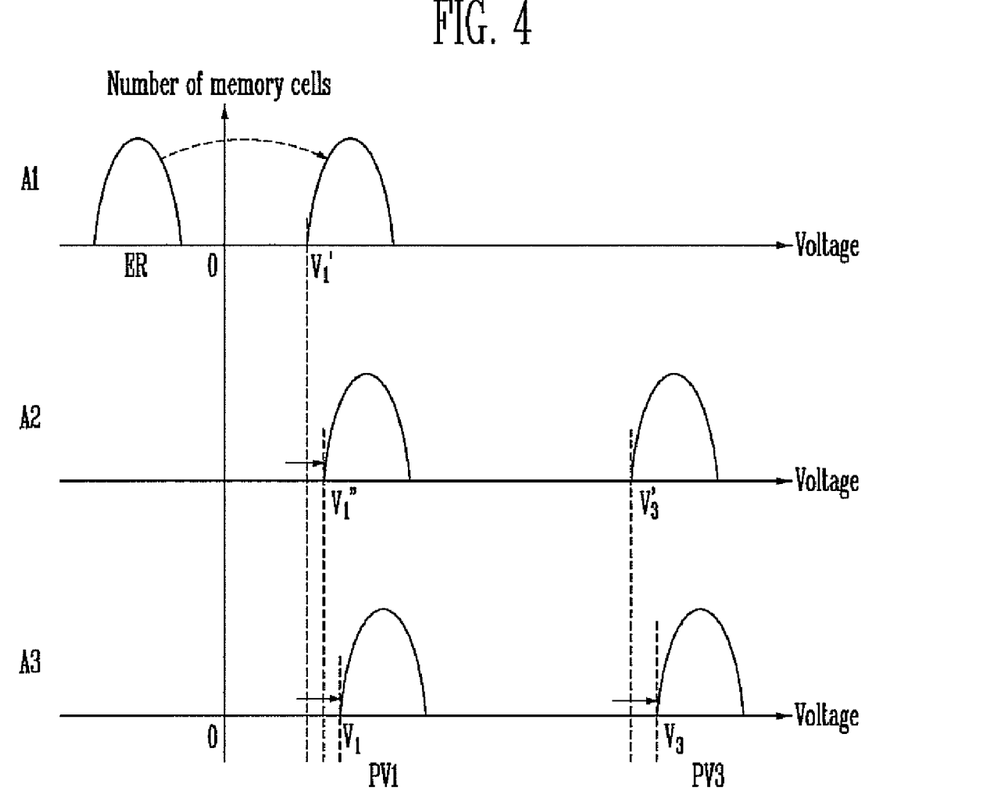
FIGS. 4 and 5 are diagrams illustrating a shift in the threshold voltage in a program operation according to an exemplary embodiment.
Figure 5:
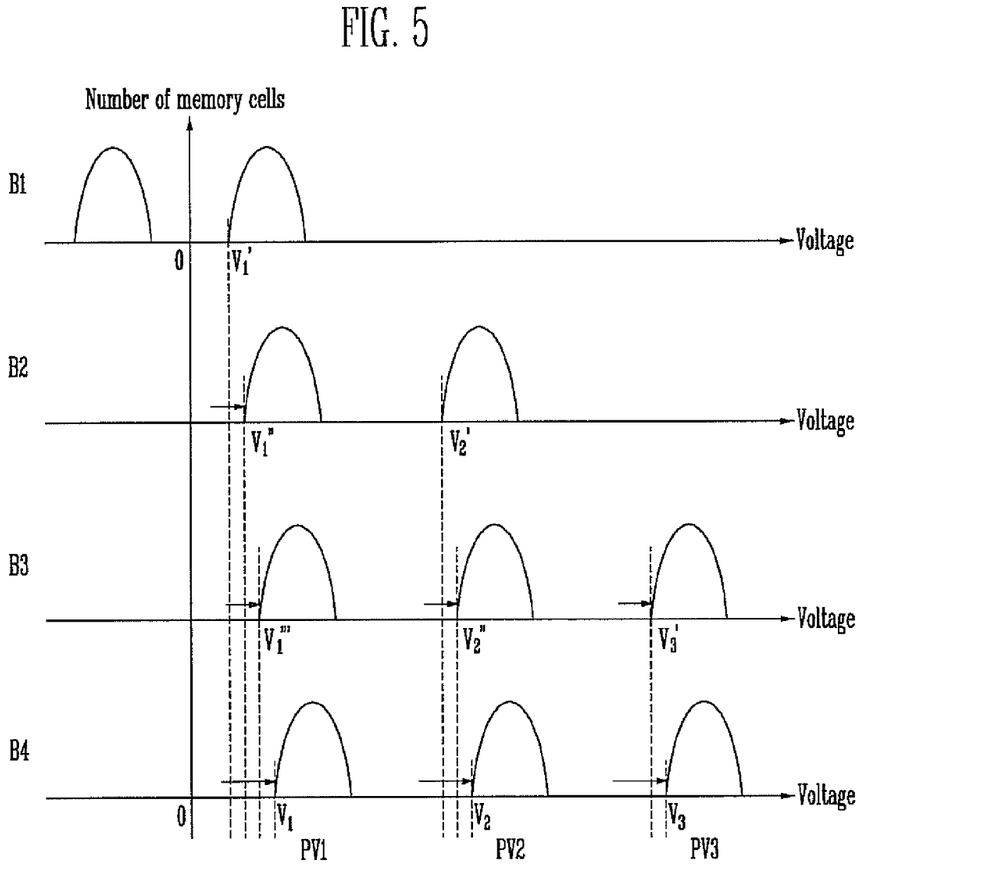

FIGS. 4 and 5 are diagrams illustrating a shift in the threshold voltage according to a program operation of this disclosure. FIG. 4 illustrates a program method of raising the threshold voltages of memory cells to be programmed to a final target level (i.e., a first target level or a third target level). FIG. 5 illustrates a program method of raising the threshold voltages of memory cells to be programmed to a final target level (i.e., a first target level, a second target level, or a third target level). In particular, a program operation may be performed on all the memory cells to be programmed irrespective of whether they belong to the even or odd cell string (Ev or Od) or may be performed on a selected one of the even and odd cell strings Ev and Od.

A method of programming all the memory cells irrespective of whether they belong to the even or odd cell string (Ev or Od) is described below.

Referring to FIG. 4, a first program operation is performed to increase the threshold voltages of memory cells Ce and Co to be programmed to a first reference level $V_1'$ lower than a first target level $V_1$(A1).

The first program operation may be performed in accordance with an incremental step pulse program (ISPP) method. The first reference level $V_1'$ is determined based on a shift in the threshold voltages of neighboring memory cells due to interference caused between memory cells during the program operations on memory cells having a higher final target level (a second or third target level). The first reference level $V_1'$ preferably is set to be lower than the first target level $V_1$ by an amount corresponding to a shift in the threshold voltages of memory cells during the program operations of neighboring memory cells having a higher final target level. After all the threshold voltages of the selected memory cells Ce and Co rise to the first reference level $V_1'$, a second program operation is performed on the memory cells Co to be programmed with a third program state PV3.

The second program operation is performed to increase the threshold voltages of the memory cells Co to be programmed with the third program state PV3 to a third reference level $V_3'$ lower than a third target level $V_3$ (A2). The second program operation may be performed in accordance with an incremental step pulse program (ISPP) method. When the second program operation is performed, the threshold voltages of the memory cells Ce to be programmed with a first program state PV1 may rise due to interference ($V_1''$) between neighboring cells.

After the second program operation is completed, a third program operation is performed to increase the threshold voltages of the memory cells Ce and Co to be programmed with the first or third program state PV1 or PV3 up to the first target level $V_1$ or the third target level $V_3$ (A3).

For example, assuming that a target level of the memory cells Ce to be programmed with the first program state PV1 is 0.5 V and a target level of the memory cells Co to be programmed with the third program state PV3 is 4.0 V, the first program operation may be performed to increase the threshold voltages of the memory cells Ce and Co, coupled to the cell strings Ev and Od, to 0.2 V (i.e., the first reference level $V_1'$). The first reference level $V_1'$ is set to be lower than the first target level $V_1$ by an expected shift in the threshold voltage resulting from interference between neighboring memory cells. In the first program operation using the ISPP method, a program voltage of 13 V to 25 V may be supplied, and the time during which the program voltage is supplied for each step may be 5 μs to 20 μs. The step bias increase may be set to 0.05 V to 0.8 V. The number of times that the program voltage is supplied may be 5 to 40 times. A program verification operation is performed between the steps for supplying the program voltage. A program verification voltage of 0 V to 5 V may be supplied to a selected word line coupled to memory cells to be programmed, and a verification pass voltage of 3 V to 8 V may be supplied to the remaining unselected word lines. Furthermore, bit lines coupled to unselected cell strings may be precharged to 0.5 V to 5 V, and voltage of 0 V to 3 V may be supplied to bit lines coupled to selected cell strings. During the verification operation, an operation of sensing a voltage level of the bit line may be performed for 1 μs to 10 μs.

The second program operation is performed to increase the threshold voltages of the memory cells Co to be programmed with the third program state PV3 to 3.7 V (i.e., the third reference level $V_3'$). Here, the threshold voltages of the memory cells Ce coupled to the even cell string Ev may rise to 0.3 V to 0.4 V.

Next, the third program operation is performed to increase all the threshold voltages of the selected memory cells Ce and Co up to the first or third target level $V_1$ or $V_3$. More particularly, the threshold voltages of the memory cells Ce are increased to 0.5 V (i.e., the first target level $V_1$), and the threshold voltages of the memory cells Co are increased to 4 V (i.e., the third target level $V_3$).

Accordingly, the threshold voltages of the selected memory cells Ce and Co may be increased to the first or third target level $V_1$ or $V_3$.

Referring to FIG. 5, a first program operation is performed to increase the threshold voltages of the selected memory cells Ce and Co to a first reference level $V_1'$ lower than a first target level $V_1$ (B1).

The first program operation may be performed in accordance with an incremental step pulse program (ISPP) method. The first reference level $V_1'$ preferably is set to a level lower than the first target level $V_1$, where the threshold voltages of the selected memory cells Ce and Co rise due to interference generated during the second and third program operations. After all the threshold voltages of the selected memory cells Ce and Co rise to the first reference level $V_1^1$, a second program operation is performed on memory cells to be programmed with a second program state PV2.

The second program operation is performed to increase the threshold voltages of memory cells to be programmed with the second program state PV2 to a second reference level $V_2'$ lower than a second target level $V_2$ (B2). Here, the memory cells programmed with the second program state PV2 may already have been programmed with $V_1'$ through the first program operation. The second program operation may be performed in accordance with an incremental step pulse program (ISPP) method. The second reference level $V_2'$ preferably is set to a level, where the threshold voltages of the memory cells to be programmed with the second program state PV2 rise due to interference generated during the third program operation, lower than the second target level $V_2$. During the second program operation, the threshold voltages of memory cells to be programmed with a first program state PV1 may rise to $V_1''$ due to interference between neighboring memory cells. After all the threshold voltages of the memory cells are increased to the second reference level $V_2'$ through the second program operation, a third program operation is performed on memory cells to be programmed with a third program state PV3 (B3).

The third program operation is performed in order to increase the threshold voltages of the memory cells to be programmed with the third program state PV3 to a third reference level $V_3'$ lower than a third target level $V_3$ (B3). Here, the memory cells programmed with the second program state PV2 may already have been programmed with the first reference level $V_1'$ through the first program operation and programmed with the second reference level $V_2'$ through the second program operation. The third program operation may be performed in accordance with an incremental step pulse program (ISPP) method. During the time for which the third program operation is performed, the threshold voltages of the memory cells to be programmed with the first program state PV1 and the threshold voltages of memory cells to be programmed with a second program state PV2 may rise to $V_1'''$ and $V_2''$, respectively, because of interference between neighboring memory cells.

After the third program operation is completed, a fourth program operation is performed to increase the threshold voltages of the memory cells to be programmed with the first program state PV1, the threshold voltages of the memory cells to be programmed with the second program state PV2, and the threshold voltages of the memory cells to be programmed with the third program state PV3 up to the first target level $V_1$, the second target level $V_2$, and the third target level $V_3$, respectively.

Hereinafter, a method of performing a program operation on a selected one of the even and odd cell strings Ev and Od is described below.

While FIG. 4 shows a case where a first program operation is performed to increase the threshold voltages of the selected memory cells Ce and Co up to the first reference level $V_1'$ lower than the first target level $V_1$ (A1), according to another example, the memory cells Ce coupled to the even cell string Ev are programmed to have the first program state PV1 and the memory cells Co coupled to the odd cell string Od are programmed to have the third program state PV3 is described.

The first program operation is performed to increase the threshold voltages of memory cells to be programmed, from among the memory cells coupled to the even cell string Ev, up to the first reference level $V_1'$ lower than the first target level $V_1$. The first program operation may be performed in accordance with an incremental step pulse program (ISPP) method. The first reference level $V_1'$ is set to be lower than a target threshold level by an amount corresponding to a shift in the threshold voltages of neighboring memory cells resulting from interference between neighboring memory cells when program operations are performed on memory cells having a higher final target level (the second or third target level). In other words, the first reference level $V_1'$ is set to a level lower than the first target level $V_1$, where the threshold voltages of the memory cells to be programmed rise because of interference between memory cells during a second program operation. After the threshold voltages of the even memory cells Ce are increased to the first reference level $V_1'$, a second program operation is performed on the odd memory cells Co to be programmed with the third program state PV3.

The second program operation is performed to increase the threshold voltages of the odd memory cells Co to be programmed with the third program state PV3 up to the third reference level $V_3'$ lower than the third target level $V_3$ (A2). The second program operation may be performed in accordance with an incremental step pulse program (ISPP) method. During the time for which the second program operation is performed, the threshold voltages of memory cells Ce to be programmed with the first program state PV1 may rise ($V_1''$) because of interference between neighboring memory cells.

After the second program operation is completed, a third program operation is performed to increase the threshold voltages of the memory cells Ce and Co to be programmed with the first or third program state PV1 or PV3 up to the first target level $V_1$ or the third target level $V_3$.

According to an example, a final target level of the even memory cells Ce to be programmed with the first program state PV1 is 0.5 V and a final target level of the odd memory cells Co to be programmed with the third program state PV3 is 4.0 V. In the first program operation, the threshold voltages of the memory cells Ce coupled to the even cell string Ev may be increased to 0.2 V (i.e., the first reference level $V_1'$).

The first reference level $V_1'$ is set to be lower than the first target level $V_1$ by an amount corresponding to a shift in the threshold voltages of memory cells resulting from interference between neighboring memory cells during the program operations of memory cells having a higher final target level. In the first program operation using the ISPP method, a program voltage of 13 V to 25 V may be supplied, and the time for which the program voltage is supplied every step may be 5 μs to 20 μs. The step bias increase for each step may be set to 0.05 V to 0.8 V. The number of times that the program voltage is supplied may be 5 to 40. A program verification operation is performed between the steps for supplying the program voltage. A program verification voltage of 0 V to 5 V may be supplied to a selected word line coupled to memory cells to be programmed, and a verification pass voltage of 3 V to 8 V may be supplied to the remaining unselected word lines. Further, bit lines coupled to unselected cell strings may be precharged to a voltage of 0.5 V to 5 V, and a voltage of 0 V to 3 V may be supplied to bit lines coupled to selected cell strings. During the program verification operation, an operation of sensing a voltage level of a bit line may be performed for 1 μs to 10 μs.

The second program operation is performed to increase the threshold voltages of the odd memory cells Co to be programmed with the third program state PV3 to 3.7 V (i.e., the third reference level $V_3'$). Here, the threshold voltages of the memory cells Ce coupled to the even cell string Ev may rise to 0.3 V to 0.4 V because of interference between neighboring memory cells.

Next, the third program operation is performed, for example, simultaneously, to increase the threshold voltages of the even memory cells Ce up to the first target level $V_1$. Next, a fourth program operation is performed to increase the threshold voltages of the odd memory cells Co up to the third target level $V_3$. That is, the threshold voltages of the memory cells Ce coupled to the even cell string Ev are increased to 0.5 V (i.e., the first target level $V_1$), and the threshold voltages of the odd memory cells Co coupled to the odd cell string Od are increased to 4 V (i.e., the third target level $V_3$).

Accordingly, the threshold voltages of the selected memory cells Ce and Co may be increased to the first and third target levels $V_1$ and $V_3$.

Referring to FIG. 5, a first program operation is performed to increase the threshold voltages of the even memory cells Ce, from among the memory cells coupled to the even and odd cell strings Ev and Od, up to the first reference level $V_1'$ lower than the first target level $V_1$ (B1). The first program operation may be performed in accordance with an incremental step pulse program (ISPP) method. The first reference level $V_1'$ is set to be lower than the first target level $V_1$ by an amount corresponding to a shift in the threshold voltages of memory cells resulting from interference between neighboring memory cells during the second and third program operations. After all the threshold voltages of the even memory cells Ce to be programmed are increased to the first reference level $V_1'$, the second program operation is performed on memory cells to be programmed with the second program state PV2.

The second program operation is performed to increase the threshold voltages of one or more even memory cells Ce to be programmed with the second program state PV2, from among the even memory cells Ce on which the first program operation has already been performed, up to the second reference level $V_2'$ lower than the second target level $V_2$ (B2). The second program operation may be performed in accordance with an incremental step pulse program (ISPP) method. The second reference level $V_2'$ is set to be lower than the second target level $V_2$ by an amount corresponding to a shift in the threshold voltages of memory cells resulting from interference between neighboring memory cells during the program operations of memory cells having a higher final target level. In the second program operation, the threshold voltages of the memory cells to be programmed with the first program state PV1 may rise ($V_1''$) because of interference between neighboring memory cells. If all the threshold voltages of the selected memory cells are increased to the second reference level $V_2'$ through the second program operation, the third program operation is performed on memory cells to be programmed with the third program state PV3 (B3).

The third program operation is performed to increase the threshold voltages of the odd memory cells Co to be programmed with the third program state PV3 up to the third reference level $V_3'$ lower than the third target level $V_3$ (B3). The third program operation may be performed in accordance with an incremental step pulse program (ISPP) method. During the third program operation, the threshold voltages of the memory cells to be programmed with the first program state PV1 and the threshold voltages of the memory cells to be programmed with the second program state PV2 may be increased to $V_1'''$ and $V_2''$, respectively, due to interference between neighboring memory cells.

After the third program operation is completed, program operations are performed, for example, simultaneously, to increase the threshold voltages of the memory cells to be programmed with the first to third program states PV1 to PV3 up to the first target level $V_1$, the second target level $V_2$, and the third target level $V_3$, respectively.

Accordingly, the threshold voltages of the selected memory cells may be increased to the first to third target levels $V_1$ to $V_3$.

In accordance with this disclosure, program operations are performed to increase the threshold voltages of neighboring memory cells to a reference level lower than a target level and increase them subsequently to the target level. Accordingly, the reliability of a nonvolatile memory device may be improved.

What is claimed is:

1. A method of programming a nonvolatile memory device, the method comprising:
   performing a first program operation on first memory cells and second memory cells so that threshold voltages of the first and second memory cells have a first reference level lower than a first target level, the first memory cells having the first target level as a final target level, and the second memory cells having a second target level higher than the first target level as a final target level;
   performing a second program operation on the second memory cells so that the threshold voltages of the second memory cells have a second reference level lower than the second target level; and
   performing a third program operation on the first and second memory cells so that the threshold voltages of the first memory cells have the first target level and the second memory cells have the second target level.

2. The method of claim 1, wherein the first to third program operations are performed in accordance with an incremental step pulse program (ISPP) method.

3. The method of claim 1, wherein the first reference level is lower than the first target level by a voltage level corresponding to a shift in threshold voltages of memory cells resulting from interference between neighboring memory cells when program operations are performed on the second memory cells.

4. The method of claim 1, further comprising performing a fourth program operation on third memory cells so that threshold voltages of the third memory cells have a third reference level lower than a third target level, before performing the second program operation, wherein the third memory cells have the third target level as a final target level, and the third target level is higher than the first target level and lower than the second target level.

5. The method of claim 4, wherein when the fourth program operation is performed, the second memory cells are programmed to have the third reference level.

6. The method of claim 4, wherein the third reference level is lower than the third target level by a voltage level corresponding to a shift in threshold voltages of memory cells resulting from interference between neighboring memory cells when program operations are performed on the second memory cells.

7. The method of claim 4, wherein the fourth program is performed in accordance with an incremental step pulse program (ISPP) method.

8. A method of programming a nonvolatile memory device, the method comprising:
   performing a first program operation on memory cells to be programmed so that threshold voltages of the memory cells have a first level lower than a final target level; and
   performing a second program operation on the memory cells so that the threshold voltages of the memory cells have the final target level,
   wherein in the first program operation, the first level is lower than the final target level by a voltage level corresponding to a shift in threshold voltages of memory cells resulting from interference between neighboring memory cells when program operations are performed on memory cells having a higher final target level than the first final target level.

9. The method of claim 8, wherein the first and second program operations are performed using the nonvolatile memory device in which cell strings, each comprising some of the memory cells, are coupled to a page buffer.

10. The method of claim 8, wherein the first and second program operations are performed in accordance with an incremental step pulse program (ISPP) method.

11. The method of claim 8, further comprising:
    verifying whether the threshold voltages of the memory cells have reached the first level, wherein the second program operation, is performed after determining that the threshold voltages of the memory cells have the first level.

12. A method of programming a nonvolatile memory device in which an even cell string and an odd cell string are coupled to a page buffer in common, the method comprising:
    performing a first program operation on first memory cells so that the first memory cells have a first threshold voltage lower than a first final target level;
    performing a second program operation on second memory cells other than the first memory cells so that the second memory cells have a second threshold voltage lower than a second final target level; and
    performing a third program operation on the first and second memory cells so that the threshold voltages of the first memory cells and the threshold voltages of the second memory cells have the respective final target levels.

13. The method of claim 12, wherein the first to third program operations are performed in accordance with an incremental step pulse program (ISPP) method.

14. The method of claim 13, wherein:
    the first program operation is performed on memory cells of a selected one of the even and odd cell strings, and
    the second program is performed on memory cells of the other one of the even and odd cell strings.

15. The method of claim 14, wherein the third program operation is simultaneously performed on the first and second memory cells.

16. The method of claim 12, further comprising performing a fourth program operation on third memory cells so that threshold voltages of the third memory cells have a third reference level lower than a third target level, before performing the third program operation, wherein the third target level as a final target level, and the third target level is between the first target level and the second target level.

17. The method of claim 16, wherein when the third program operation is performed, the threshold voltage of the third memory cells have the third target level.

* * * * *

UNITED STATES PATENT AND TRADEMARK OFFICE
CERTIFICATE OF CORRECTION

PATENT NO. : 8,351,267 B2  Page 1 of 1
APPLICATION NO. : 12/827754
DATED : January 8, 2013
INVENTOR(S) : Seung Hwan Baik et al.

It is certified that error appears in the above-identified patent and that said Letters Patent is hereby corrected as shown below:

On the Title Page, change Item (73), the Assignee section to read as follows:

(73)  Assignee:  Hynix Semiconductor Inc.,
  Gyeonggi-do (KR)

Signed and Sealed this
Twelfth Day of February, 2013

Teresa Stanek Rea
*Acting Director of the United States Patent and Trademark Office*